United States Patent [19]
Holberg et al.

[11] Patent Number: 6,038,116
[45] Date of Patent: Mar. 14, 2000

[54] HIGH VOLTAGE INPUT PAD SYSTEM

[75] Inventors: Douglas R. Holberg, Wimberley; Nadi R. Itani; David R. Welland, both of Austin, all of Tex.

[73] Assignee: Cirrus Logic, Inc., Fremont, Calif.

[21] Appl. No.: 09/075,449

[22] Filed: May 8, 1998

[51] Int. Cl.[7] ....................................... H02H 9/00
[52] U.S. Cl. ............................................ 361/56
[58] Field of Search ........................ 361/56, 111, 91, 361/117, 118, 119, 126, 127, 91.1; 330/252, 253, 255, 207 P; 257/355–363

[56] References Cited

U.S. PATENT DOCUMENTS 4,605,980  8/1986  Hartranft et al. .................. 361/56
5,545,909  8/1996  Williams et al. .................. 257/355
5,764,464  6/1998  Botker et al. ..................... 361/56

*Primary Examiner*—Ronald W. Leja
*Attorney, Agent, or Firm*—Sabath & Truong; Robert P. Sabath; J. P. Violette

[57] ABSTRACT

A high voltage input pad and method for accepting electrostatic discharge (ESD) surges without damage to an input semiconductor amplifier. The protection system includes a metal gate transistor, and n-well resistors which provide ESD protection. Protection is further provided against large voltages coupled to an amplifier by connecting an input bipolar junction transistor to the negative input connection of the amplifier. Negative surges are directed to ground with an anode grounded diode connected at its cathode to the negative input connection of the amplifier.

5 Claims, 5 Drawing Sheets

HIGH VOLTAGE INPUT PAD SYSTEM

RELATED APPLICATIONS

This application is related to patent application Ser. Nos. 09/015,382, 09/075,491, 09/075,506, 09/075,446, and 09/075,348, respectively entitled *"Image Processor Circuits, Systems, and Methods"* having inventors Sandra Marie Johnson, Shih-Chung Chao, Nadi Rafik Itani, Caiyi Wang, Brannon Craig Harris, Ash Prabala, Douglas R. Holberg, Alan Hansford, Syed Khalid Azim, and David R. Welland; *"Digital Camera Signal Processor and Method"* having inventors Syed Khalid Azim, Shih-Chung Chao, Brannon Craig Harris, and Ash Prabala; *"Pipelined Analog-to-Digital Converter (ADC) Systems, Methods, and Computer Program Products"* having inventors Sandra Marie Johnson and David R. Welland; *"Histogram-Based Automatic Gain Control Method and System for Video Applications"* having inventors Nadi Rafik Itani, Caiyi Wang, and David R. Welland, and *"Selectable Threshold Multimode Gain Control Apparatus and Method for Setting Mutually Continuous Analog, Digital, and Shutter Gain Levels"* having inventors Nadi Rafik Itani, Caiyi Wang, and David R. Welland; each of these applications filed on even date herewith May 8, 1998 and incorporated herein by reference in their entirety.

BACKGROUND OF THE INVENTION

1. Field of the Invention

The field of this invention relates to high voltage input pad systems and methods and more particularly to electrostatic discharge protection for high voltage input pads.

2. Description of Related Art

The technical problems of interfacing semiconductor chips which operate with a 5 volt power supply with charge coupled devices (CCDs) have been inadequately addressed in the related art. In particular, the related art requires CCDs to operate from a 15 volt supply and to have an output signal with an offset of approximately 12 volts. Such systems with a standard ESD pad do not allow input voltages this large, because the input voltage range is limited to the value of the power supply range plus the voltage of two diode drops. In order to interface to an analog front end semiconductor chip which operates with a 5 volt power supply, the input CCD signal is AC-coupled through an external capacitor in order to reduce the input signal to a predetermined offset level. In one electrostatically discharge protected pad arrangement of the related art, the input signal pad is connected through a resistor to an input amplifier. The resistor of this pad arrangement is in turn coupled to the connecting nodes of two pairs of first and second series-connected diodes which are coupled between ground potential and VDD. This circuit causes electrostatic discharge surges to be discharged through the first and second series-connected diodes either to ground or VDD. Thus, the voltage at a gate is prevented from getting much higher than VDD or much lower than ground. As a result, the voltage level of the gate outside of the semiconductor chip remains limited and prevents the chip from fusing and shorting to ground. This approach offers a certain level of electrostatic discharge protection in particular situations. The operating range of such input circuitry is, however, limited to a one diode drop below ground and one diode drop above VDD. This is an unacceptable input operating voltage range for many electric circuits without using an external AC coupling capacitor and systems which require ESD protection.

SUMMARY OF THE INVENTION

According to one embodiment of the present invention, a circuit for protecting against the effects of electrostatic discharge includes a metal gate transistor (MGT) having a metal gate, a source connected to ground, and a drain; and first and second n-well resistors respectively connected to an input connection and an output connection for the circuit. With the pad ESD protection, voltage swings larger than the 5V supply can still couple to the amplifier through the internal AC coupling capacitor. This problem is solved as follows:

According to one embodiment of the present invention, an amplifier is protected from electrostatic discharge surges by connection of an anode grounded diode with its cathode connected to the input of the amplifier to handle negative surges, and in parallel therewith a bipolar junction transistor for diverting positive electrostatic surges to ground. According to one embodiment of the present invention, the base of the bipolar junction transistor is connected to the gate and drain of the higher potential one of a pair of series connected MOSFET transistors. According to one embodiment of the present invention, the lower potential one of the series connected MOSFET transistors is connected at its gate and drain to the drain of the higher potential transistor and to the positive input connection of the amplifier. The protection circuitry according to the present invention thus protects camera semiconductor chips operating with a low voltage power supply from the detrimental effects of electrostatic discharge.

DETAILED DESCRIPTION OF A PREFERRED MODE

Figure 1A:
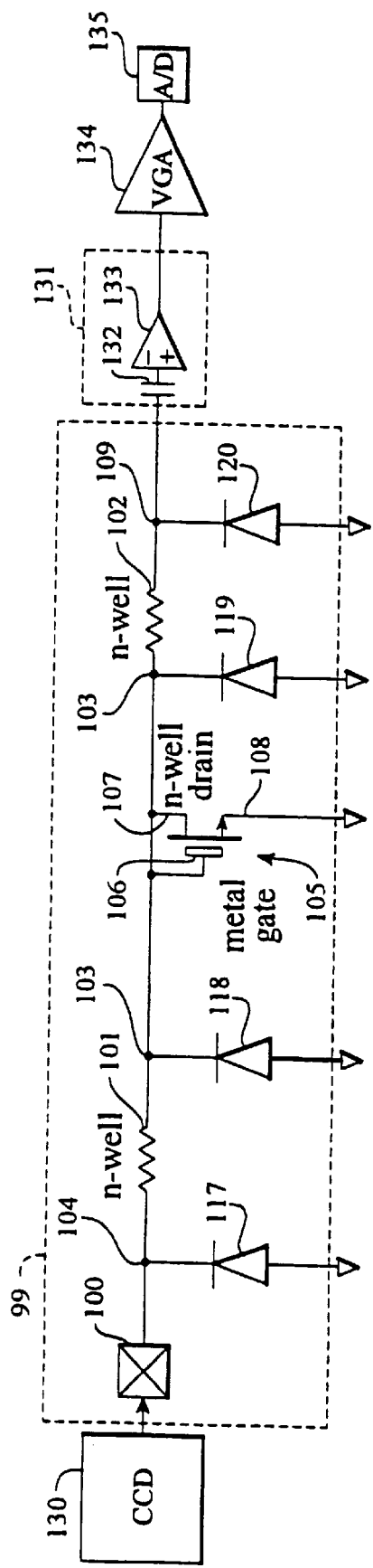
FIG. 1A is a circuit diagram of an electrostatic discharge pad system according to one embodiment of the present invention.

Referring now to FIG. 1A, there is shown a circuit diagram of an electrostatic discharge pad system (EDPS) 99 according to the present invention, which has a large input voltage range. In particular, EDPS 99 includes an input pad 100 for receiving electric signals from a selected device such as for example a charge coupled device (CCD) 130. According to the present invention, there is no off-chip prior art DC blocking capacitor between input pad 100 and CCD 130. Such an off-chip DC blocking capacitor of the prior art increases overall system costs. According to the prior art, the anode of a diode to 5 volts is connected to pad 100. A typical input voltage to pad 100 is 15 volts which would affirmatively turn on the diode to 5 volts without a DC blocking capacitor. The EDPS 99 further includes first and second n-well resistors, respectively 101 and 102, which are connected in series to each other at a common node 103 between the pad 100 and an input gain stage 131. The EDPS 99 additionally includes a metal gate transistor 105 and first through fourth diodes 117 and 120, respectively connected at their anodes to ground, respectively 117 through 120. According to one embodiment of the present invention, first through fourth diodes 117–120 are fabricated with an n-well and a p-substrate. The metal gate transistor 105 includes a metal gate 106, an n-well drain 107, and a source 108 connected to ground. According to the present invention, the metal gate transistor 105 includes a thick layer of oxide between the gate and the channel. According to the present invention, the metal region of the metal gate transistor 105 sets up an electric field large enough to cause an inversion resulting in majority carrier current flow. According to one embodiment of the present invention, metal gate transistor 105 includes a plurality (e.g., on the order of 100 transistor devices) of thick field metal gate transistor devices in parallel to improve performance. The cathode of diode 117 is connected at node 104 between pad 100 and first n-well transistor 101. The cathode of second diode 118 is connected between first n-well resistor 101 and the gate and drain of metal gate transistor 105 at node 103. The cathode of third diode 119 is connected between the gate and drain of metal gate transistor 105 and second n-well resistor 102 at node 103. The cathode of the fourth diode 120 is connected to the output connection of second n-well resistor 102 leading to an input gain stage 131 at node 109. Input gain stage 131 according to one embodiment of the present invention includes a reduced size DC coupling capacitor (RSDCC) 132 and an amplifier 133, which in turn is connected to VGA 134 and analog-to-digital converter (ADC) 135. According to one embodiment of the present invention, RSDCC 132 is fabricated upon the same semiconductor chip as EDPS 99, to reduce costs and improve reliability. EDPS 99 according to the present invention permits receipt of large input voltage range voltage signals at input pad 100, while still providing substantial electrostatic discharge protection. According to the present invention, EDPS 99 contains no diodes connected to VDD. Accordingly, the upper range of the input voltage is a function of the breakdown voltage of the diodes to ground (i.e., diodes 117–120) and the threshold voltage of the metal gate transistor 105. For example, the upper range is limited by the breakdown voltage. Moreover, the signal path of EDPS 99 contains no n-plus contacts outside of n-wells. In particular, according to the present invention, each of diodes 117–120 is formed with n-well to substrate junctions. The breakdown voltage according to one embodiment of input pad 100 is approximately 22 volts. According to the present invention, the use of a metal gate transistor 105 provides enhanced protection. According to one embodiment of the present invention, an n-well drain is used for metal gate transistor 105 to facilitate operation. Additionally according to the present invention, a metal gate 106 is fabricated for metal gate transistor 105 at a first metallization layer of the semiconductor structure. By using the first metallization layer rather than poly as a gate according to the present invention, the oxide between the metal gate transistor channel and the metal gate 106 is of enhanced thickness. This enhanced thickness of the oxide in the channel has the effect of increasing the threshold voltage of metal gate transistor 105. According to one embodiment of the present invention, the threshold voltage of metal gate transistor 105 is approximately 25 volts. Accordingly, substantial protection is provided according to the present invention against electrostatic discharge hits. Furthermore, an input voltage range between approximately −0.7 volts and approximately 22 volts is provided according to the present invention. The output of input gain stage 131 is connected according to one embodiment of the present invention in turn to a VGA 134 and an analog-to-digital converter 135.

Figure 1B:
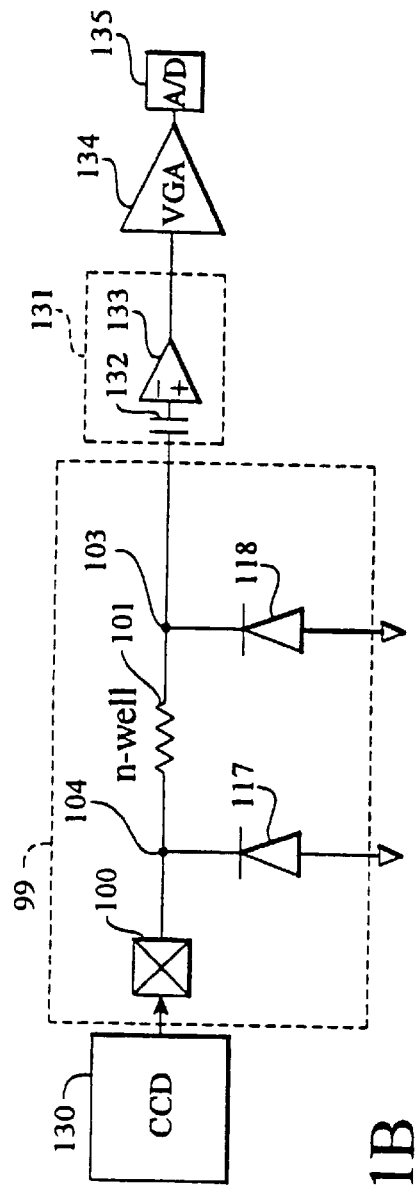
FIG. 1B is a circuit diagram of an electrostatic discharge pad system according to another embodiment of the present invention.

FIG. 1B is a circuit diagram of an electrostatic discharge pad system according to another embodiment of the present invention. In particular, EDPS 99 includes an input pad 100 for receiving electric signals from a selected device such as for example a charge coupled device (CCD) 130. According to the present invention, there is no off-chip prior art DC blocking capacitor between input pad 100 and CCD 130. Such an off-chip DC blocking capacitor of the prior art increases overall system costs. According to the prior art, the anode of a diode to 5 volts is connected to pad 100. A typical input voltage to pad 100 is 15 volts which would affirmatively turn on the diode to 5 volts without a DC blocking capacitor. The EDPS 99 further includes first and second n-well resistors, respectively 101 and 102, which are connected in series to each other at a common node 103 between the pad 100 and an input gain stage 131. The EDPS 99 additionally includes first and second diodes 117 through 120, respectively connected at their anodes to ground. According to one embodiment of the present invention, first and second diodes 117 and 118 are fabricated with an n-well and a p-substrate. The cathodes of respective diodes 117 and 118 are connected to opposite sides of the n-well resistor 101. Input gain stage 131 according to one embodiment of the present invention includes a reduced size DC coupling capacitor (RSDCC) 132 and an amplifier 133, which in turn is connected to VGA 134 and analog-to-digital converter (ADC) 135. According to one embodiment of the present invention, RSDCC 132 is fabricated upon the same semiconductor chip as EDPS 99, to reduce costs and improve reliability. EDPS 99 according to the present invention permits receipt of large input voltage range voltage signals at input pad 100, while still providing substantial electrostatic discharge protection. According to the present invention, EDPS 99 contains no diodes connected to VDD. Accordingly, the upper range of the input voltage is a function of the breakdown voltage of the diodes to ground (i.e., diodes 117–120). According to one embodiment of the present invention, EDPS 99 includes a pad 100 and first and second n-well resistors connected to each other at a common node, and a diode connected at its anode to ground and at its cathode to the common node. In general according to the present invention, a distributed series resistance having distributed diodes anode connected to ground, comprises EDPS 99.

Figure 2:
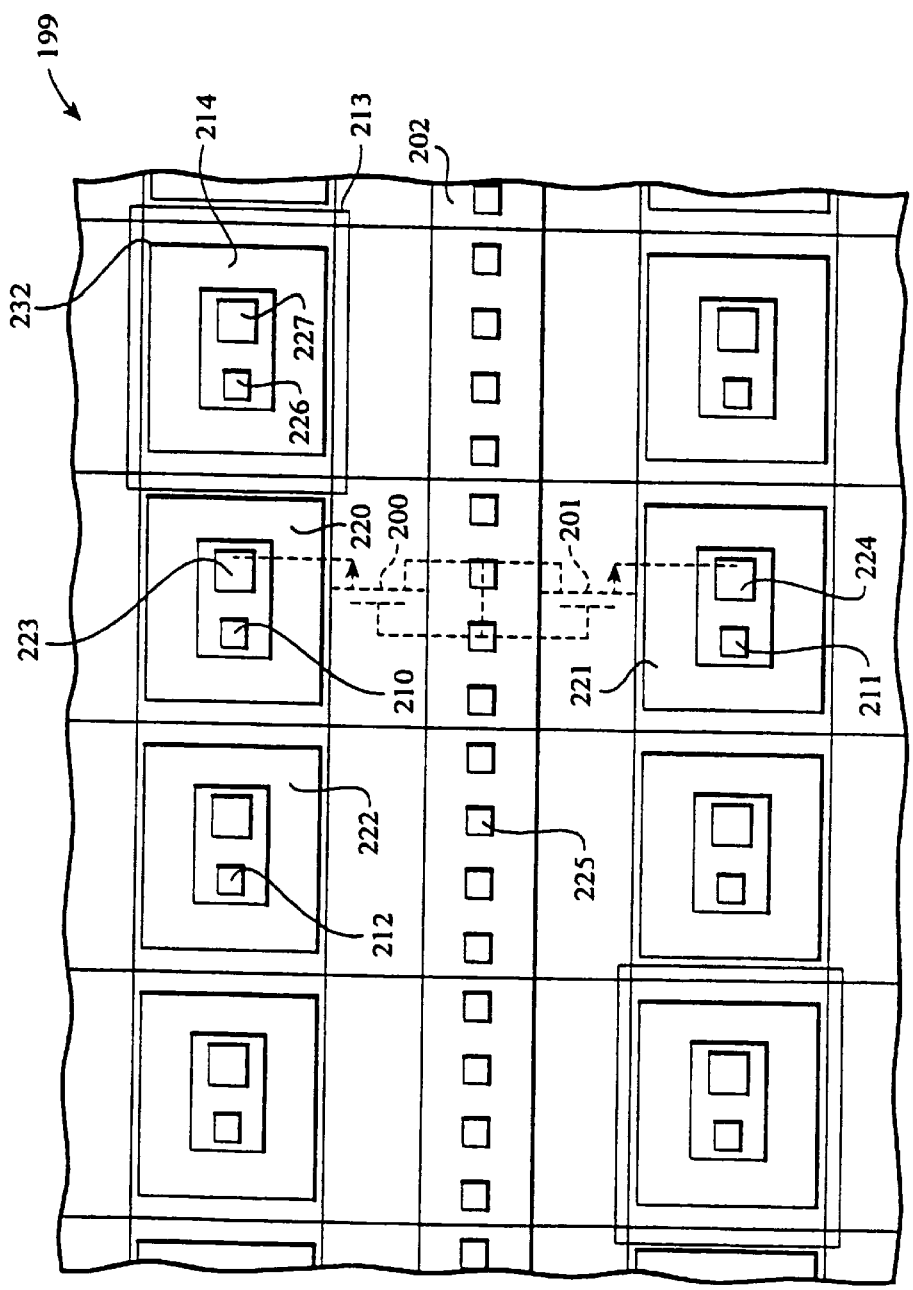
FIG. 2 is a diagram of the layout of a metal gate transistor according to the present invention.

Referring now to FIG. 2 there is shown a diagram of the layout of a metal gate transistor structure according to the present invention. In particular, FIG. 2 shows a semiconductor arrangement 199 including first and second metal gate transistors 200 and 201 and an n-well 202 connecting the first and second transistors 200, 201. Semiconductor arrangement 199 particularly includes a region where a lightly-doped n-type diffusion is implanted and driven into the p-substrate to create n-well 202. A heavier-doped diffusion is implanted within the region of the n-well 202 and is driven in to form a region in which a metal-silicon ohmic contact can be made. This forms the drain of the metal gate transistor 200. The semiconductor arrangement 199 also includes an additional heavily doped diffusion of n-plus type material within the p-substrate and in close proximity to the aforementioned n-well, to which a metal-silicon ohmic contact is fabricated. The semiconductor arrangement 199 also includes a first layer of metal (metal 1) which is in ohmic contact (at contact 225) with the heavier doped n-type diffusion material lying within the lighter doped n-well. This first layer of metal covers the region between the n-well and the n-plus diffusion, so that with sufficient potential difference between this first layer of metal and the p-substrate, an inversion region is formed so that majority carriers flow between these two regions in proximity to one another. The semiconductor arrangement 199 also includes contacts 210 and 211 which connect a first layer metal to the n-plus diffusion lying within the p-substrate. This first layer of metal provides an intermediate connection to which vias 223 and 224 further connect this first layer of metal to a second layer of metal (metal 2) which is connected to ground. The semiconductor arrangement 199 also includes a connection of the p-substrate to ground with a substrate tie 213. Substrate tie 213 includes a p-plus diffusion 214 which is connected to a first layer of metal (metal 1) with contact 226 providing an intermediate connection to which via 227 further connects this first layer of metal to a second layer of metal (metal 2) which is connected to ground, thereby providing a means to tie the substrate to ground. These substrate ties are interspersed appropriately so that no substrate tie is separated from another by more than about 75 micrometers according to one embodiment of the present invention.

Figure 3:
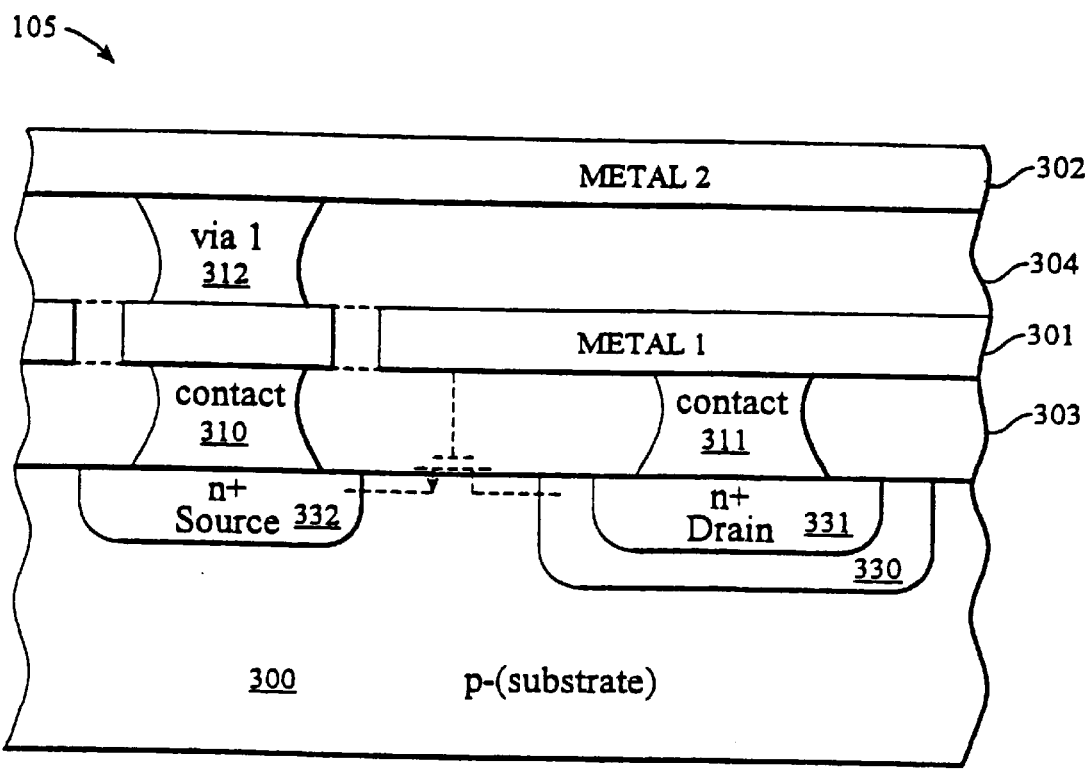
FIG. 3 is a cross-sectional diagram of a portion of a metal gate transistor according to the present invention.

Referring now to FIG. 3, there is shown a cross-sectional diagram of a metal gate transistor 105 according to the present invention. In particular, metal gate transistor 105 is fabricated in a semiconductor arrangement including a p-substrate 300, a first metallization layer 301, a second metallization layer 302, and first and second insulating layers 303 and 304. The p-substrate 300 is provided with an n-well drain 330 and an n-plus drain diffusion region 331 in the n-well drain 330. The p-substrate 300 is additionally provided with a diffused n-plus source region 332. Insulative region 303 includes first and second contacts 310 and 311. Insulative layer 304 includes a via 312. Contact 310 connects an isolated region of first metallization layer 301 to n-plus source region 332 and second metallization layer 302 through via 312. First metallization layer 301 serves as the gate for the metal gate transistor 105. A phantom representation of metal gate transistor 105 is shown in dashed format including respective gate, source, and drain connections.

Figure 4:
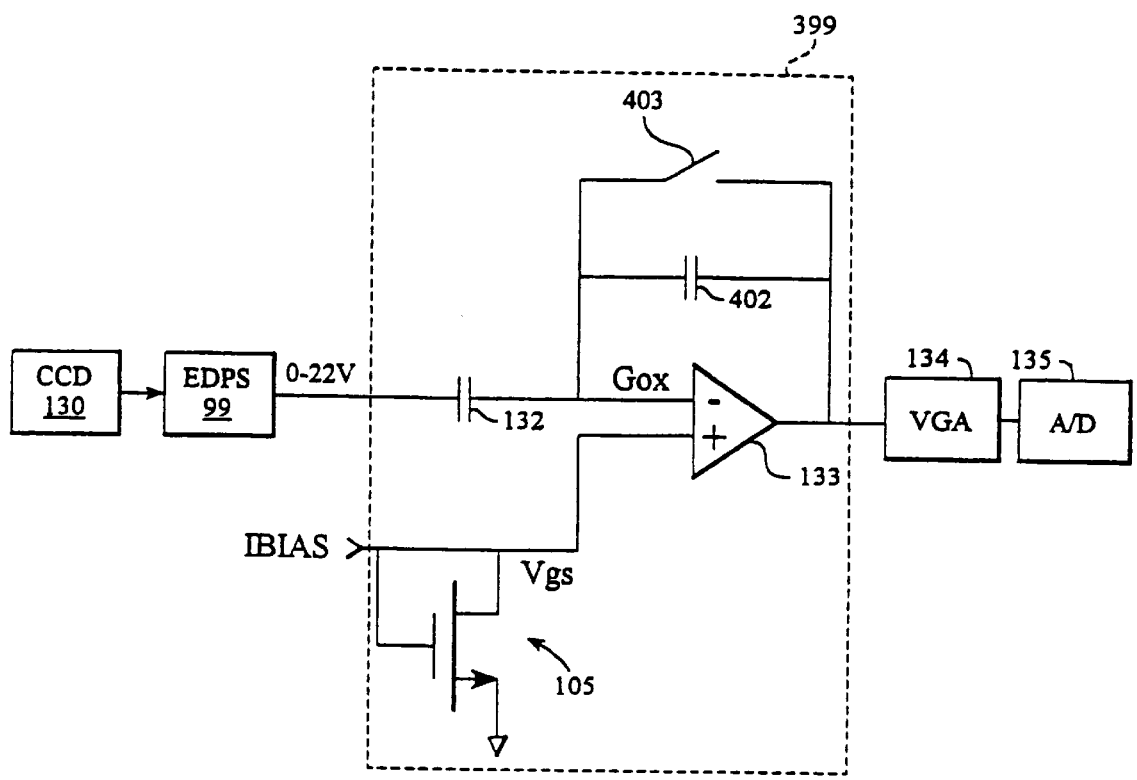
FIG. 4 is a diagram of an amplifier circuit that interfaces to the pad according to the present invention, which is used to step down and couple large input voltages to an acceptably workable operating level.

Referring now to FIG. 4, there is shown a diagram of an amplifier stage connected in a circuit 399 according to the present invention, which is used to couple large input voltages received from EDPS 99, down to a workable operating level. EDPS 99 receive analog signals from CCD 130, according to one embodiment of the present invention. Voltage signals are received by circuit 399 which includes an amplifier 133 having positive and negative input terminals; a transistor 105 having connected gate and drain coupled to the positive input terminal of amplifier 133; and an input metal capacitor 132 connected to the negative input terminal of amplifier 133. Circuit 399 further includes a feedback capacitor 402 connecting the output of amplifier 133 to its negative input terminal which has gate oxide subject to damage by excessive input voltage swings. Circuit 399 further includes a feedback switch 403 in parallel with feedback capacitor 402 for selectively shorting out capacitor 402. The input positive terminal of amplifier 133 is connected to the gate and drain of transistor 105. According to one embodiment of the present invention, limited swings of input signal voltage can be accepted by circuit 399. During normal operation according to one embodiment of the present invention, an input signal is AC-coupled, which brings its voltage level to an acceptable range so that the input of the amplifier 133 does not receive a voltage which could damage the gate oxide of the amplifier 133. When an electrostatic discharge is encouraged causing an approximately 22 volt swing on the input side of input metal capacitor 132 and is coupled to the negative input side of amplifier 133, the gate oxide in amplifier 133 will fuse. The circuit shown in FIG. 5 is used to prevent such a voltage swing from affecting amplifier 133 detrimentally.

Figure 5:
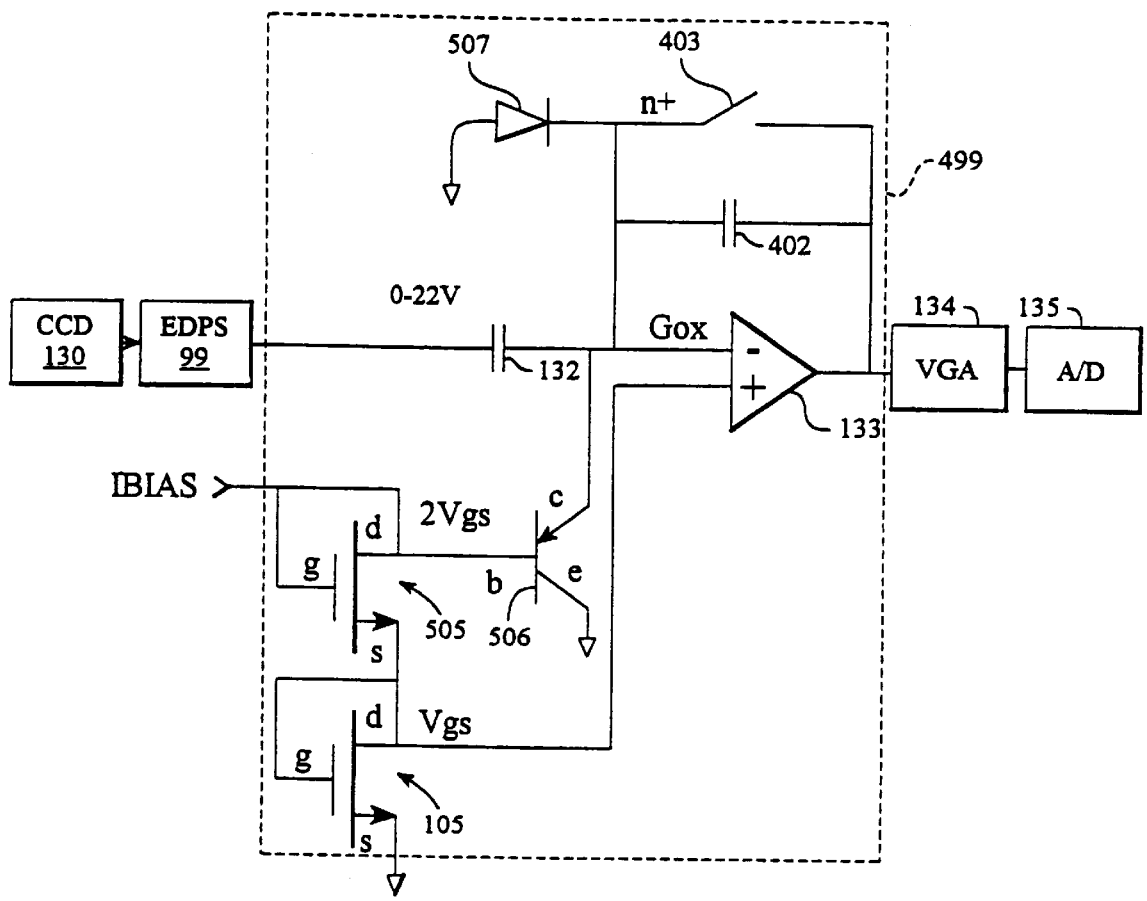
FIG. 5 is a diagram of an amplifier circuit that interfaces to the pad according to another embodiment of the present invention, which is used to couple large voltages and to protect against voltage spikes during electrostatic discharge events.

Referring now to FIG. 5, there is shown a diagram of a circuit 499 according to another embodiment of the present invention, which is used to couple large input voltages received from EDPS 99, and to protect against large voltage spikes experienced during electrostatic discharge hits. EDPS 99 receives analog signals from CCD 130, according to one embodiment of the present invention. In particular, circuit 499 includes an amplifier 133 having positive and negative input terminals; a transistor 105 having a gate and drain connected to the positive input terminal of amplifier 400; an input metal capacitor 132 connecting the output of the EDPS 99 and the negative input terminal of the amplifier. Circuit 499 further includes a feedback capacitor 402 connecting the output of amplifier 133 to its negative input terminal and a feedback switch 403 in parallel with feedback capacitor 402 for selectively shorting out capacitor 402. Circuit 499 further includes a second transistor 505 in series with first transistor 105 again with gate and drain coupled, effectively transforming transistors 105 and 505 into series connected MOS diodes. Circuit 499 further includes a bipolar junction transistor 506 and an anode grounded diode 507, each of them connected to the negative input terminal of amplifier 133. Further, IBIAS is connected to the base of bipolar junction transistor 506. According to the present invention, the negative connection of amplifier 133 is held to less than approximately 10 to 12 volts by the circuitry shown in FIG. 5 to prevent the gate oxide from fusing. During normal operation, the base of bipolar junction transistor 506 does not turn on. However, if there is a positive electrostatic discharge hit, the charge is dissipated through bipolar junction transistor 506. If there is a negative electrostatic discharge hit, the charge is dissipated through the diode formed by NMOS feedback switch 507. Accordingly, amplifier 133 is protected against damaging voltage spikes. The input positive terminal is additionally connected to the gate and drain of transistor 105. According to an embodiment of the present invention, up to approximately a 22 volt spike can be accepted at the input of circuit 499 without any detrimental effects. Input signals are AC-coupled with metal capacitor 132 for operation under normal conditions with a relatively small input signal swing. When an electrostatic discharge hits, up to approximately 22 volt swings on the input side of capacitor 132 are harmlessly discharged before reaching amplifier 133.

What is claimed is:

1. A circuit for protecting against the effects of electrostatic discharge, comprising:

an amplifier having first and second input connections and an output connection;

an input metal capacitor having a first terminal connected to said first input connection and having a second terminal for receiving an input signal;

a first transistor including source, drain, and gate connections, and said drain and gate being connected to each other and to the second input connection of the amplifier; and a second transistor connected in series with said first transistor, said second transistor including source, drain and gate connections, and said gate and drain of said second transistor being connected to each other, and the source of said second transistor being connected to the drain of said first transistor.

2. The circuit according to claim 1, further comprising a grounded anode diode having a cathode connected to said first input of said amplifier.

3. The circuit according to claim 1 further including a bipolar junction transistor connected to the first input of said amplifier.

4. The circuit according to claim 3 wherein said bipolar junction transistor includes a base which is connected to the gate of said second transistor.

5. The circuit of claim 1, further comprising:

an n-well resistor having first resistor connection coupled to the second terminal of the input metal capacitor to apply said input signal and having a second resistor connection for receiving another input signal; and first and second diodes each having an anode and a cathode, the anodes being connected to ground and the cathode of the first and second diodes being directly connected to said first and second resistor connections, respectively.

* * * * *

UNITED STATES PATENT AND TRADEMARK OFFICE
CERTIFICATE OF CORRECTION

PATENT NO.    : 6,038,116
DATED         : March 14, 2000
INVENTOR(S)   : Douglas R. Holberg, Nadi R. Itani and David R. Welland It is certified that error appears in the above-identified patent and that said Letters Patent is hereby corrected as shown below:

Column 1,
Line 4, please delete "09/015,382" and insert therefor -- 09/075,382 --

Signed and Sealed this

Twenty-eighth Day of December, 2004

JON W. DUDAS
*Director of the United States Patent and Trademark Office*